(12) United States Patent
Tabara

(10) Patent No.: US 7,265,058 B2
(45) Date of Patent: Sep. 4, 2007

(54) METHOD OF MANUFACTURING SEMICONDUCTOR DEVICE

(75) Inventor: Suguru Tabara, Hamamatsu (JP)

(73) Assignee: ROHM Co., Ltd., Kyoto (JP)

( * ) Notice: Subject to any disclaimer, the term of this patent is extended or adjusted under 35 U.S.C. 154(b) by 0 days.

(21) Appl. No.: 10/682,229

(22) Filed: Oct. 8, 2003

(65) Prior Publication Data

US 2004/0082172 A1    Apr. 29, 2004

(30) Foreign Application Priority Data

Oct. 9, 2002    (JP)    ............................. 2002-296478

(51) Int. Cl.
  *H01L 21/302*    (2006.01)
  *H01L 21/461*    (2006.01)

(52) U.S. Cl. ..................................... 438/734

(58) Field of Classification Search ................ 438/714, 438/719, 734, 740, 706, 710, 723; 216/58, 216/67, 72
See application file for complete search history.

(56) References Cited

U.S. PATENT DOCUMENTS

| 4,789,426 | A | * | 12/1988 | Pipkin | ......................... | 438/714 |
| 5,466,636 | A | * | 11/1995 | Cronin et al. | ................ | 438/392 |
| 5,804,088 | A | * | 9/1998 | McKee | ......................... | 216/47 |
| 5,948,703 | A | * | 9/1999 | Shen et al. | ................... | 438/714 |
| 6,380,031 | B1 | * | 4/2002 | Mehrad et al. | ............. | 438/257 |
| 6,551,941 | B2 | * | 4/2003 | Yang et al. | ................. | 438/714 |
| 6,651,678 | B2 | * | 11/2003 | Shintani et al. | .............. | 134/1.2 |
| 6,703,269 | B2 | * | 3/2004 | Brown et al. | ................ | 438/199 |

FOREIGN PATENT DOCUMENTS

| JP | 9-69511 |   | 3/1997 |
| JP | 11-220123 | * | 8/1999 |
| JP | 11-260799 | * | 9/1999 |
| JP | 2001-7085 |   | 1/2001 |
| JP | 2001-007085 | * | 1/2001 |
| JP | 2002-043284 | * | 2/2002 |
| JP | 2002-43284 |   | 2/2002 |
| JP | 2003-151954 |   | 5/2003 |

OTHER PUBLICATIONS

Nomura, et al., Formation of Very Thin Silicon Oxide Film and Interface Evaluating Technique, Realize Co., Ltd., or N. Cabrera, et al., Rep. Prog. Phys., 12, 163 (1949).

* cited by examiner

*Primary Examiner*—Parviz Hassanzadeh
*Assistant Examiner*—Roberts Culbert
(74) *Attorney, Agent, or Firm*—Hamre, Schumann, Mueller & Larson, P.C.

(57) ABSTRACT

A method of manufacturing a semiconductor device comprises, in patterning of a conductive film having a grain boundary on a very thin dielectric film, a first etching step of carrying out anisotropic etching until most of the conductive film in a flat portion disappears, and a second etching step of increasing a selective ratio to the dielectric film to etch the conductive film in an unnecessary portion such that a thickness of the dielectric film provided under the grain boundary can be held to prevent oxidation species from reaching an interface with a substrate after the first etching step.

8 Claims, 7 Drawing Sheets

PARTIALLY ETCHED polySi

GATE OXIDE SURFACE
SURFACE MORPHOLOGY OF polySi AND GATE OXIDE

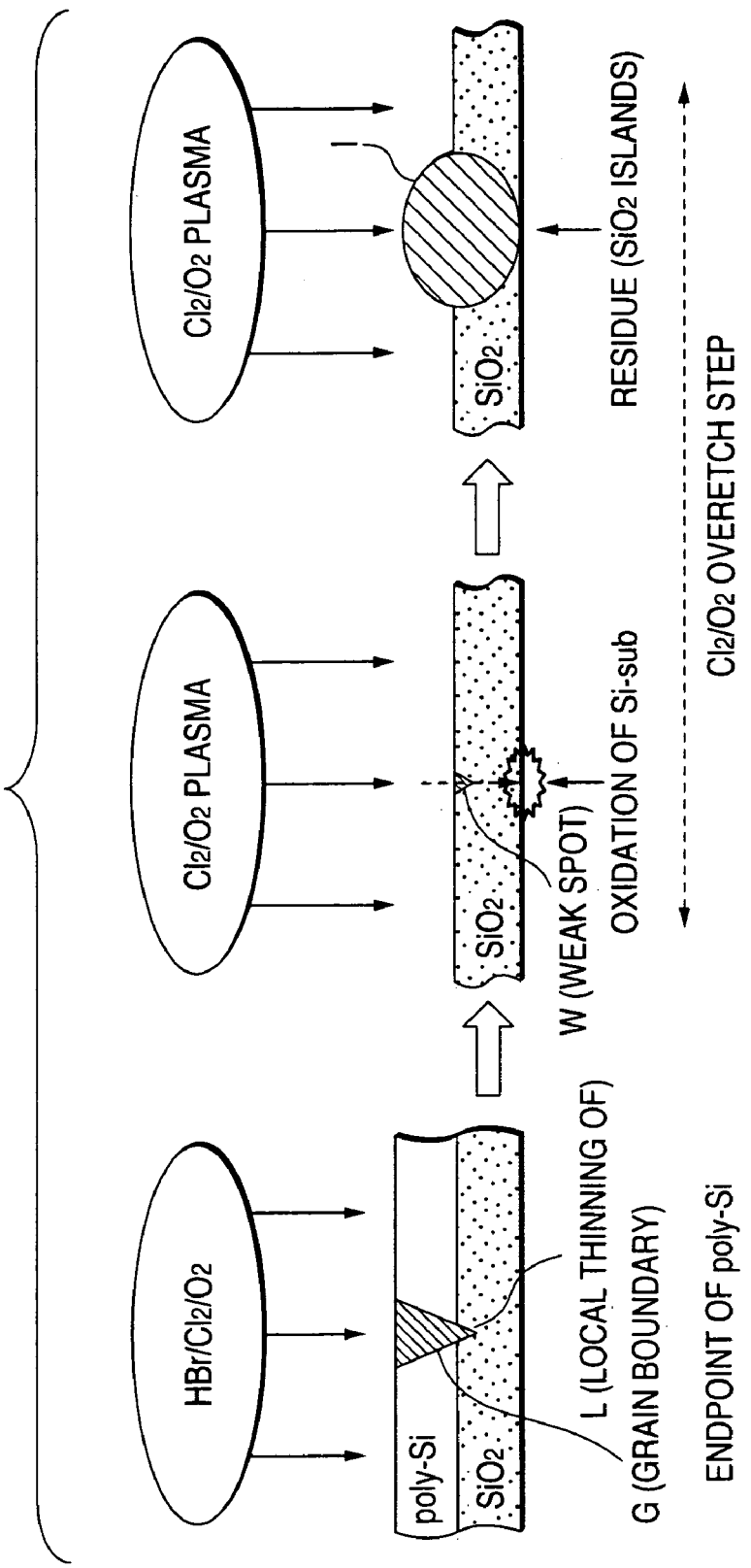

METHOD OF MANUFACTURING SEMICONDUCTOR DEVICE

BACKGROUND OF THE INVENTION

1. Field of the Invention

The present invention relates to a method of manufacturing a semiconductor device, and more particularly to an etching method for forming a conductive film pattern on a thin dielectric film having a thickness of 5 nm or less.

2. Description of the Related Art

In recent years, the microfabrication and integration of a semiconductor device has been increasingly enhanced, and a technique for carrying out a processing in a subquarter micron with high precision and reproducibility has been required.

For example, there has been proposed a method which is intended for forming a polycrystalline silicon film on a gate oxide film to be a dielectric film with high precision and uses a first etching method having a high etching rate and a second etching method having a high selective ratio to an oxide film to be a substrate in consideration of the damage of the oxide film such as shown in paragraph 15 of Japanese unexamined patent publication JP-A-9-69511.

In this method, it is assumed that a vertical etching shape can be obtained without etching an insulating layer to be a lower layer, and furthermore, a residue can be completely eliminated in a step portion. In this case, a gate oxide film has a thickness of approximately 20 nm at most.

However, the thickness of the gate oxide film is increasingly decreased. In particular, a gate oxide film having a thickness of 5 nm or less has recently been proposed. In the case in which an MOSFET is to be formed by using such a thin gate oxide film, a silicon type conductive film such as a polycrystalline silicon film formed on an upper layer is subjected to patterning, thereby forming a gate electrode. By using the gate electrode as a mask, an impurity ion for forming source and drain regions is implanted.

Conventionally, an etching step for patterning the polycrystalline silicon film has been executed by using an ECR plasma etching device shown in FIG. 1.

The ECR plasma etching device comprises a quartz window 102 fixed to an upper part in a chamber 101, a lower electrode 103 on which a substrate to be processed is provided, a vacuum pump (not shown) for evacuating air from the chamber 101, and a gas supply system (not shown) for supplying a desirable reactive gas into the chamber 101. A plasma is generated by a microwave having a frequency of 2.45 GHz which is introduced into the chamber 101 through the quartz window 102. 104 and 105 denote coils provided for generating a plasma having a high density by an electronic cyclotron resonance. A positive ion in the generated plasma is incident almost vertically on the substrate to be processed by a self-bias voltage induced to the lower electrode 103 by a high-frequency wave supplied from a high-frequency power source 107 through a high-frequency matching device 108 to the lower electrode 103. Consequently, vertical patterning can be carried out.

FIG. 5 shows a TEM photograph of an etching surface in the case in which a polycrystalline silicon film is subjected to patterning with a $Cl_2/O_2$ gas to be a reactive gas by using the ECR plasma etching device. The polycrystalline silicon film is formed on a gate oxide film comprising a silicon oxide film having a thickness of 2.75 nm. Moreover, FIGS. 6(a) and 6(b) show the enlarged photographs of the surface of the polycrystalline silicon film and that of the gate oxide film which are taken at this time, respectively.

In this case, an etching residue remains to draw a wavy pattern on the surface and the surface has a concavo-convex shape as is apparent from FIGS. 5 and 6.

It is apparent that the concavo-convex portions of the surface variously influence subsequent steps.

For example, in some cases in which a complicated impurity diffusion profile is to be formed, particularly, the case in which shallow source and drain regions are to be formed or the case in which source and drain regions having an LDD structure in a very small diffusion depth are to be formed, the condition of the surface of a substrate exposed from a mask greatly influences the profile of an ion to be implanted and a characteristic is varied.

Moreover, there has also been proposed a device having a multilayer structure in which an amorphous silicon film or a polycrystalline silicon film is provided on a gate oxide film thus formed, the polycrystalline silicon film and the amorphous silicon film are annealed, and recrystallization is carried out by using, as a seed, a silicon substrate exposed from a window formed partially, thereby forming a single crystal layer, and a device is formed in the single crystal layer. However, the polycrystalline silicon film formed on the concavo-convex surface successively maintains the exact surface condition. For this reason, it is very hard to form a single crystal layer of high film quality.

In the case in which a film formed on a thin dielectric film is to be patterned, thus, there is a problem in that the surface of the dielectric film formed on a substrate becomes rough. In some cases, this causes various drawbacks in the formation of a device.

Therefore, various experiments and investigations were made. As a result, it was found that in the case in which a silicon type conductive film having a grain boundary such as a polycrystalline silicon film is to be patterned on a dielectric film, the protruded portion of silicon oxide (bulged silicon oxide) is formed on the surface of the silicon oxide provided under the grain boundary of the silicon type conductive film to be the upper layer.

FIG. 7 shows a mechanism for generating the bulge of the silicon oxide film. In a grain boundary portion G of the polycrystalline silicon, the surface is concaved. Therefore, the gate oxide film is locally thinned immediately before the polycrystalline silicon film disappears from the surface of the substrate (a local thinned region L is formed, FIG. 7(a)). According to a model of Cabrera-Mott related to the natural oxide film growth of the surface of the silicon substrate such as shown in Non-patent publications of "Formation of Very Thin Silicon Oxide Film and Interface Evaluating Technique" written by Shigeru Nomura and Ei Fukuda, Realize Co., Ltd.", or N. Cabrera and N. F. Mott, Rep. Prog. Phys., 12, 163 (1949). JP-A-9-69511, the growth rate of an oxide film depends on a difference in an electric potential which is generated on both ends of the oxide film and is rapidly reduced with an increase in the thickness of the oxide film. The reason is that ionized oxidation species or atoms constituting the substrate drift into the oxide film, resulting in the formation of an oxide film.

In a weak spot W in which the thickness of the oxide film is reduced, accordingly, the oxidation rate of the substrate is lower than that in other portions so that an island I of silicon oxide is formed as shown in FIG. 7(c). This can be supposed to be the bulge of the silicon oxide film. If an oxygen plasma is used in place of a $Cl_2/O_2$ plasma, the bulge of the silicon oxide film is not generated. If $Cl_2$ is added at a rate of 21% for $O_2$, the bulge of the silicon oxide film is formed. It has been found that the bulge of the silicon oxide film also becomes remarkable with an increase in a $Cl_2$ concentration.

FIG. 8 shows a result obtained by changing the thickness of a silicon oxide film to measure the amount of an increase in the thickness of the silicon oxide film on a surface thereof. Curves a and b indicate the amount of an increase in the thickness of the silicon oxide film and the final thickness of the silicon oxide film, respectively. An axis of abscissa indicates the initial thickness of the silicon oxide film. From this result, it is apparent that the thickness of the silicon oxide film is more increased with a decrease in the initial thickness from 4 nm.

From this drawing, it is possible to easily estimate that the increase in the thickness of the oxide film in a part of the silicon oxide film becomes great and the oxide film is grown like an island in the case in which the same portion is thinned (locally) at a first etching step.

In many cases, the roughness of the surface adversely affects a device characteristic as described above. For this reason, there has been desired an etching method capable of smoothing a surface and carrying out etching with high pattern precision.

SUMMARY OF THE INVENTION

The invention has been made in consideration of the actual circumstances and has an object to provide an etching method capable of reducing an etching residue and obtaining a fine pattern with high precision.

The invention provides a method of manufacturing a semiconductor device comprising, in patterning of a conductive film having a grain boundary on a very thin dielectric film, a first etching step of carrying out anisotropic etching until most of the conductive film in a flat portion disappears, and a second etching step of increasing a selective ratio to the dielectric film to etch the conductive film in an unnecessary portion in a state in which the conductive film is caused to remain such that a thickness of the dielectric film provided under the grain boundary can be held to prevent oxidation species from reaching an interface with a substrate after the first etching step.

According to such a structure, first of all, the anisotropic etching is carried out to bring a state in which the conductive film is caused to remain such that the oxidation species do not damage the interface with the substrate, and a pattern is efficiently formed with high precision. In addition, the conductive film in the unnecessary portion is etched by using a gas having a high selectivity for the dielectric film. Therefore, it is possible to efficiently carry out excellent pattern formation without an etching residue on a surface. At the second etching step, the dielectric film is grown on the surface of the substrate and the selective ratio to the dielectric film is increased so that the thickness of the dielectric film can be maintained to prevent the ionized oxidation species or atoms constituting the substrate from drifting into the dielectric film, thereby forming a dielectric film (an oxide film). Even if a part of the dielectric film is damaged at the first etching step, therefore, it is possible to prevent a local oxidation from being generated to bulge the substrate.

As described above, at the second etching step, a process parameter such as a gas composition or an in-chamber pressure is selected. In the initial stage of the step, consequently, the etching is carried out while growing silicon oxide by the reaction of the oxidation species and the substrate. After the thickness of the oxide film reaches a constant thickness, the oxide film can be rarely etched. Consequently, it is possible to prevent the generation of a residue, and furthermore, it is possible to form a pattern with high precision without reducing the dielectric film.

If the second etching step is executed in such a gas atmosphere that a concentration of the oxidation species is more increased than that in the first etching step, moreover, patterning having a higher anisotropy can be carried out at the first etching step and etching having a higher selectivity can be carried out at the second etching step. Thus, it is possible to obtain a surface having a high reliability without a residue.

In an ordinary case, if the second etching step is executed in such a gas atmosphere that a concentration of oxygen is higher than that in the first etching step, an excellent profile can be obtained.

Moreover, nitriding species brings the surface of the substrate into a passive state. Even if etching gas species for two-step etching are selected to execute the second etching step in such a gas atmosphere that the concentration of the nitriding species is higher than that in the first etching step, therefore, it is possible to obtain an excellent profile.

If the second etching step is executed at a lower pressure than a pressure in the first etching step, moreover, a mean free step is also prolonged so that it is possible to carry out the etching while protecting a thin dielectric film on the surface of the substrate.

If the second etching step is executed at an in-chamber pressure of 2 mTorr or less, furthermore, a plasma density is decreased and a damage on the surface of the substrate is reduced. Consequently, a surface protecting property can be enhanced.

Moreover, this method is particularly effective for the case in which the dielectric film is a silicon oxide film having a thickness of 5 nm or less based on various experimental results, of which reasons are not obvious.

Furthermore, it is desirable that the conductive film should be a silicon type conductive film.

Moreover, it is desirable that the silicon type conductive film should be a polycrystalline silicon film.

Furthermore, the first and second etching steps are particularly effective for the case in which an ECR plasma etching step is to be carried out.

In addition, they are also effective for a helicon wave plasma etching device, and mainly, are particularly effective for the case in which an etching process is to be carried out at a low pressure.

At the second etching step, furthermore, an $HBr/Cl_2/O_2$ plasma is used. Consequently, a selectivity for the dielectric film such as a silicon oxide film can be enhanced by the addition of HBr and the etching can be carried out without damaging the dielectric film.

For the first etching step, moreover, an etching step using a $Cl_2/O_2$ plasma is employed. Consequently, anisotropic etching can efficiently be carried out.

At the first and second etching steps, furthermore, the $HBr/Cl_2/O_2$ plasma is used and the concentration of oxygen is set to be lower than that of an oxygen plasma to be used at the second etching step, which is also effective.

In the case in which the dielectric film is a gate oxide film and the conductive film is a gate electrode, moreover, a smooth surface having no etching residue can be obtained also when ion implantation for forming source and drain diffusion layers is to be carried out by using the conductive film as a mask at a subsequent step. Consequently, an impurity can be implanted uniformly and a diffusion profile can be obtained with high precision.

When a polycrystalline silicon gate electrode provided on a very thin gate oxide film is to be etched, moreover, there are provided the first etching step and the second etching step using a hydrogen bromide $(HBr)/Cl_2/O_2$ plasma after the first etching step. At the second etching step, consequently, it is possible to carry out patterning while forming a silicon oxide film on the interface of the gate oxide film and the substrate. Also in the case in which the gate oxide film is very thin, therefore, it is possible to form the pattern of a gate electrode while maintaining the smooth surface of the gate oxide film without reducing the film. It is possible to produce the same advantages by a mixed plasma of hydrogen halide (HX), halogen ($X_2$) and oxygen.

The etching residue includes an etching product such as the irregular bulge of a silicon oxide film generated during the etching.

BRIEF DESCRIPTION OF THE DRAWINGS

FIG. 7 is a view showing a change in a surface condition at a conventional etching step.

DESCRIPTION OF THE PREFERRED EMBODIMENTS

Next, an embodiment of the invention will be described in detail with reference to the drawings.

Figure 1:
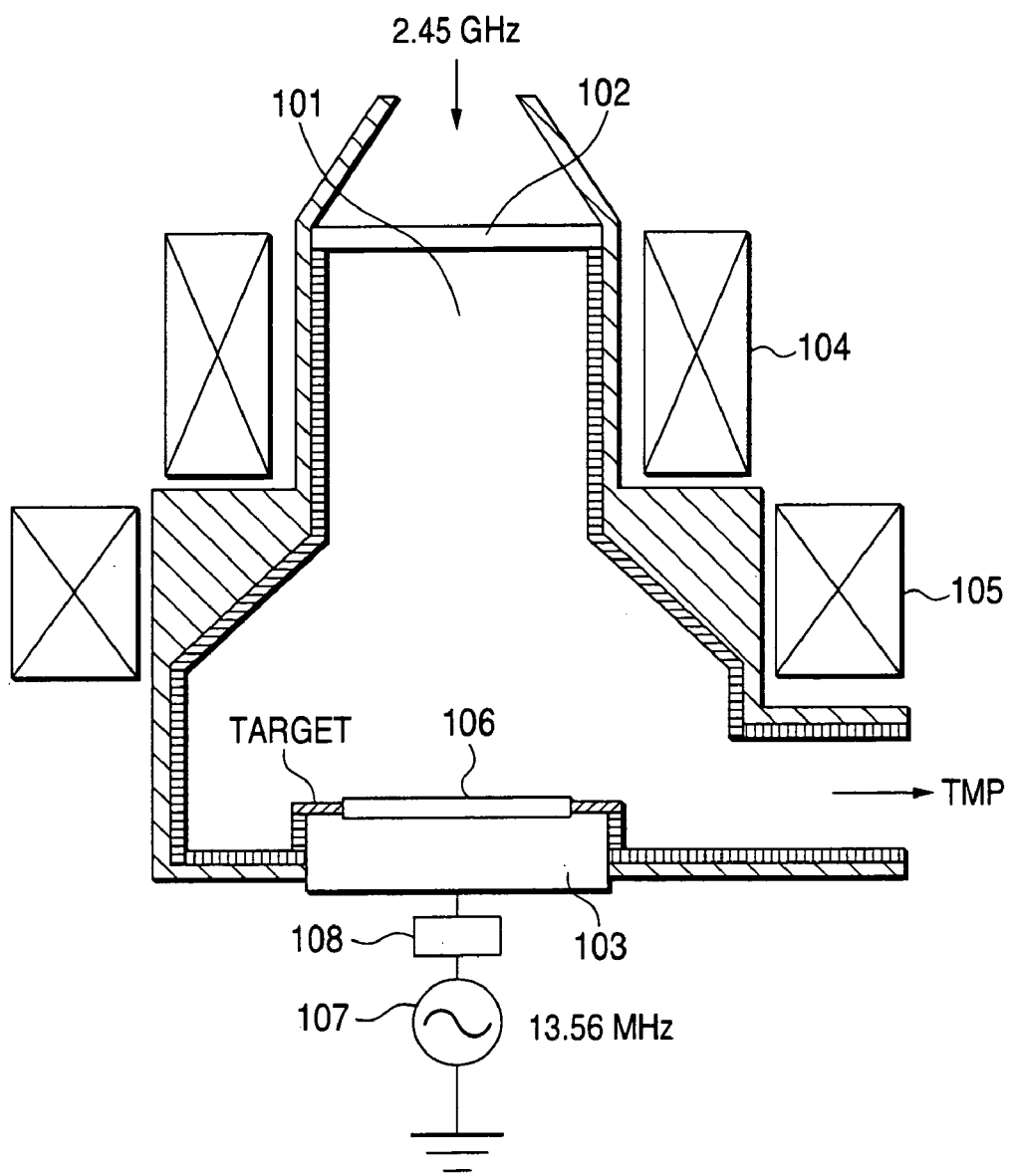
FIG. 1 is a view showing an ECR etching device to be used in an embodiment of the invention.
Figure 2A:
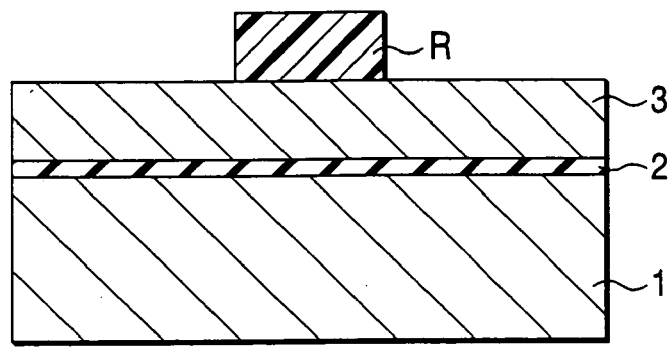
FIG. 2 is a view showing a pattern forming step according to the embodiment of the invention.
Figure 2B:
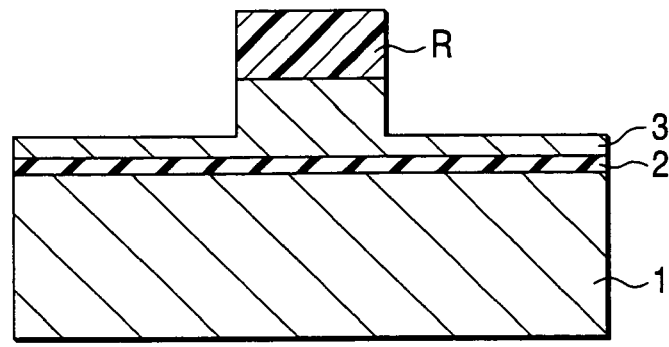
Figure 2C:
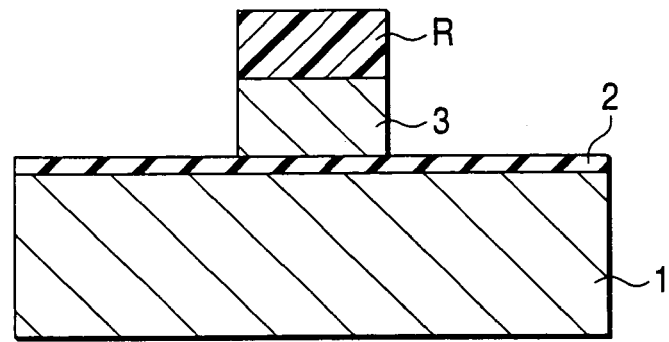

First of all, as shown in FIG. 1, an ECR plasma etching device is used. The structure of the device has been described above. FIGS. 2(a) to 2(c) are views showing the steps of forming a gate pattern using the device.

In FIG. 2(a), a gate oxide film 2 comprising a thermal oxide film having a thickness of 2 nm to 5 nm is formed on the surface of a silicon substrate 1 having a thickness of 8 inches provided with an isolating region, and furthermore, a non-doped polycrystalline silicon film 3 having a thickness of 150 nm is formed on the gate oxide film 2 and a resist pattern R having a thickness of 500 nm is formed thereon through an antireflection film (not shown). The antireflection film is constituted by a TIN layer having a thickness of 40 nm and an organic antireflection film having a thickness of 60 nm which is formed thereon.

A substrate 106 to be processed is mounted on a lower electrode 103 in a chamber 101 of the device so as to be fixed by a vacuum chuck. The inner part of the chamber 101 is evacuated by using a 3000 l/s turbo-pump and a microwave having a frequency of 2.45 GHz is introduced from a window provided in the upper part of the chamber 101, and five-step etching is carried out on the following conditions.

First of all, an etching process in a first step is carried out on the following conditions. Then, a gas and a pressure are regulated and etching processes in steps 2 to 5 are sequentially carried out.

Step 1: First of all, an organic antireflection film is etched by using a mixed gas of $Cl_2/O_2$ at a pressure of 1 mTorr, a source power (a microwave) of 1000 W and a bias power of 70 W.

Step 2: A TiN antireflection film is etched by using a $Cl_2$ gas at a pressure of 0.5 to 1 mTorr, a source power of 1000 to 1400 W and a bias power of 50 to 70 W. TIN is subjected to etching.

Step 3: Polycrystalline silicon is etched by using a mixed gas of $HBr/Cl_2/O_2$ at a pressure of 1 to 2 mTorr, a source power of 600 to 800 W and a bias power of 23 to 30 W. A flow ratio of $O_2$ is set to be 5% or less.

Step 4: Polycrystalline silicon is overetched by using a mixed gas of $HBr/5\% O_2$ at a pressure of 2 to 4 mTorr, a source power of 600 to 800 W and a bias power of 23 to 30 W.

Step 5: Polycrystalline silicon is overetched by using a mixed gas of $HBr/Cl_2/24\% O_2$ at a pressure of 1 to 2 mTorr, a source power of 600 to 800 W and a bias power of 20 to 40 W. A flow ratio of $O_2$ at this step is to be set to be higher than that in each of the steps 3 and 4 in order to enhance a selectivity for $SiO_2$ and is preferably set to be 15% or more.

The etching shape thus obtained is shown in FIGS. 2(b) and 2(c). At the step 3, the etching is carried out until a part of a gate oxide film is started to be exposed. At the end of the step, therefore, the polycrystalline silicon (silicon type conductive film) remains in most portions on the surface of the substrate as shown in FIG. 2(b).

At the steps 4 and 5, as shown in FIG. 2(c), the etching is carried out on the condition that a selective ratio to the gate oxide film is increased, and the remaining polycrystalline silicon film is removed to expose the gate oxide film.

A fourth etching step is introduced for finishing an etching sectional shape to be rectangular in a silicon type conductive film having a low n-type impurity concentration, that is, a non-doped polycrystalline silicon film, a $p^+$ polycrystalline silicon film or an n-type polycrystalline silicon film, and may be omitted if the etching shape does not need to be regulated.

Figure 3:
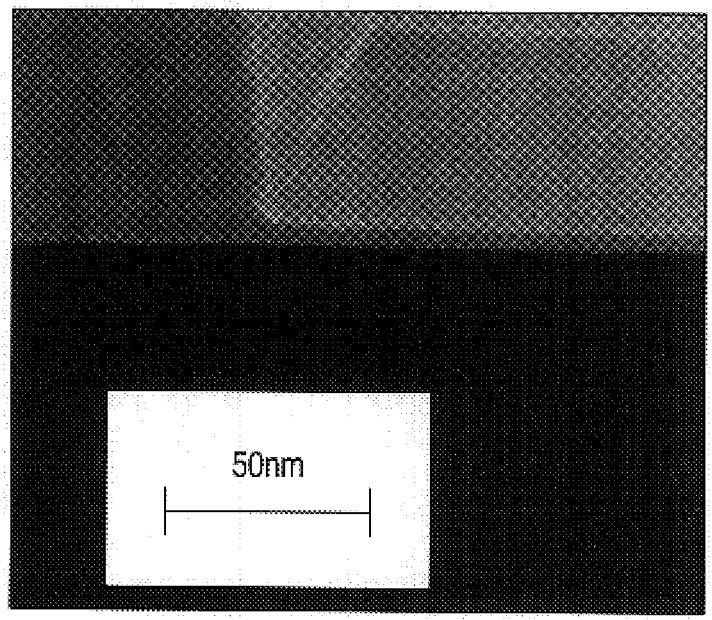
FIG. 3 is a view showing a TEM photograph illustrating the structure of the substrate surface of a pattern obtained at the step.
Figure 4:
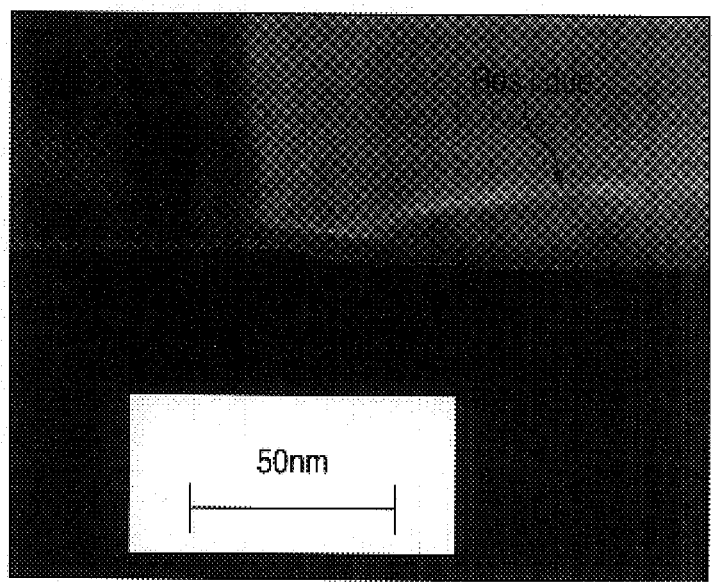
FIG. 4 is a view showing a TEM photograph illustrating the structure of the substrate surface of a pattern obtained in a process according to a conventional example.
Figure 5:
FIG. 5 is a view showing a TEM photograph obtained after a conventional gate electrode pattern is formed.
Figure 6A:
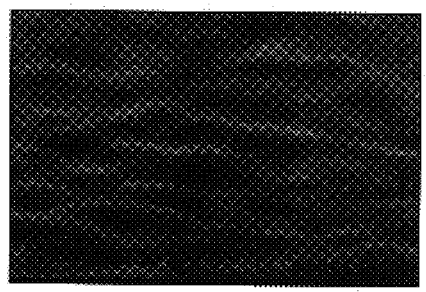
FIG. 6 is an explanatory view showing an etching process by a conventional method.
Figure 6B:
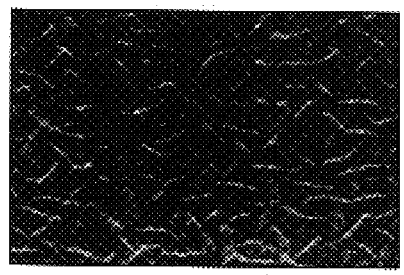
Figure 8:
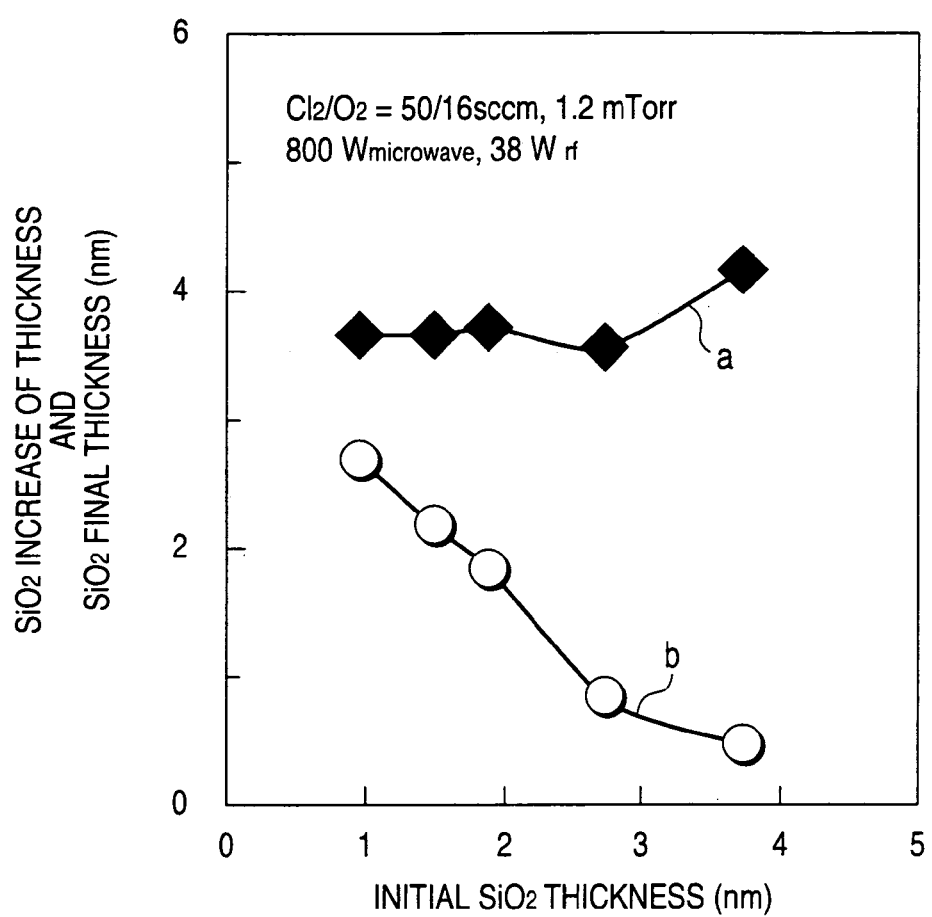
FIG. 8 is a chart showing a film thickness and an increase in the film thickness after the end of etching with respect to the initial thickness of a silicon oxide film at the conventional etching step.

FIG. 3 shows a TEM photograph of a gate oxide film portion having a thickness of 2 nm on which a gate electrode pattern is thus formed. It is apparent that a smooth surface condition can be obtained without a residue, and furthermore, an original thickness of 2 nm is also maintained. In this connection, FIG. 4 shows a TEM photograph of the gate oxide film portion obtained after the etching is carried out with $Cl_2/O_2$ up to an endpoint at the step 5 as in the conventional art. As is apparent from a comparison between FIGS. 4 and 3, according to the invention, the gate oxide film is not reduced but a smooth surface can be obtained. On the other hand, a residue is generated on the surface of the gate oxide film which is formed by a conventional method.

The third etching step is not restricted to the mixed gas of HBr, $Cl_2$ and $O_2$ but it is desirable that such a gas ratio as to have a proper anisotropy should be selected.

The combination of the gases in the fourth and fifth etching steps can be optionally selected from a gas type in the following Table 1. At the fifth step, a gas which might reduce a selective ratio to an oxide film, for example, $Cl_2$ is contained. It is necessary to set an oxygen flow to be larger than that in the fourth step in order to prevent the selective ratio to the oxide film from being reduced even if the gases are contained. Desirable oxygen flow rates in the fourth and fifth steps also depend on set conditions other than an oxygen flow and are supposed to be 3% to 10% and 10% to 28%, respectively.

TABLE 1

| Gas type for fourth etching step | Gas type for fifth etching step |
|---|---|
| 1) HBr/$O_2$ | 1) HBr/$Cl_2$/$O_2$ |
| 2) Mixed gas of at least one of HBr and HI, and $O_2$ | 2) Mixed gas of at least one of HBr and HI, at least one of $Cl_2$, $Br_2$ and $I_2$, and $O_2$ |
| 3) Mixed gas of at least one of HBr and HI, at least one of $Br_2$ and $I_2$, and $O_2$ | |

Next, the thickness of the gate oxide film was changed from 2 nm to 5 nm and the condition of the surface of the gate oxide film was measured.

As a result, a polycrystalline silicon film is etched by two-step etching including an anisotropic etching process and a selective etching process enhancing oxidation species (an etching method having a combination of a first etching step and a second etching step) as in the invention. Consequently, it is possible to obtain the surface of the gate oxide film which has no etching residue and is smooth and excellent.

By using, as a mask, the pattern of a gate electrode thus formed, accordingly, it is possible to uniformly implant an impurity also when forming very shallow source and drain diffusion regions. Consequently, it is possible to obtain an excellent impurity profile.

On the other hand, in the case in which the etching is completely carried out with only $Cl_2+O_2$ without the addition of HBr, a silicon oxide film is bulged in a portion corresponding to the grain boundary of polycrystalline silicon.

Referring to the pressure conditions of the two-step etching, similarly, a pressure may be equal. In order to carry out excellent etching, it is also possible to reduce a pressure in the selective etching after the first anisotropic etching.

Thus, the HBr is added at a fifth etching step (the second etching step to be the etching step for the polycrystalline silicon) in the embodiment. Therefore, a selective ratio to $SiO_2$, $Si_3N_4$ or a resist can be enhanced, only the polycrystalline silicon film can be etched well and the generation of a residue can be prevented.

A thickness D of a residual polycrystalline silicon film in switching from the anisotropic etching to the selective etching is determined by a timing for the endpoint detection of the anisotropic etching (the first etching step). If an etching endpoint is early determined by using an Interferometric Endpoint Prediction method in such a manner that a gate oxide film is not exposed in a grain boundary portion, it is possible to carry out more excellent etching having neither a residue nor the punch-through of the gate oxide film.

Figure 9:
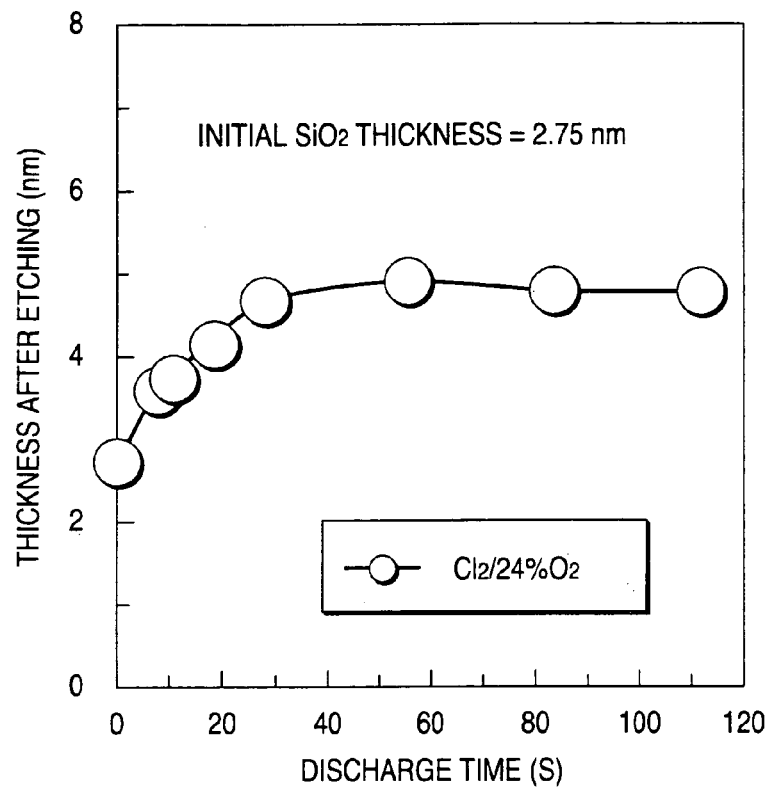
FIG. 9 is a chart showing the discharge duration dependency of the thickness of a silicon oxide film after a second etching step.

Furthermore, FIG. 9 is a graph in which the thickness of an oxide film is plotted for a discharge duration in the oxidation of a silicon substrate with a $Cl_2/O_2$ plasma. It is apparent that the thickness of the oxide film is not increased any longer when the thickness of the oxide film reaches approximately 5 nm. It is a matter of course that the surface of the oxide film is etched by an ion bombardment. For this reason, FIG. 9 shows that the etching rate of the oxide film and the oxidation rate of the substrate are equal to each other in the vicinity of a portion in which the oxide film has a thickness of 5 nm, and neither the oxidation of the substrate nor the etching of the oxide film progress apparently.

Figure 10:
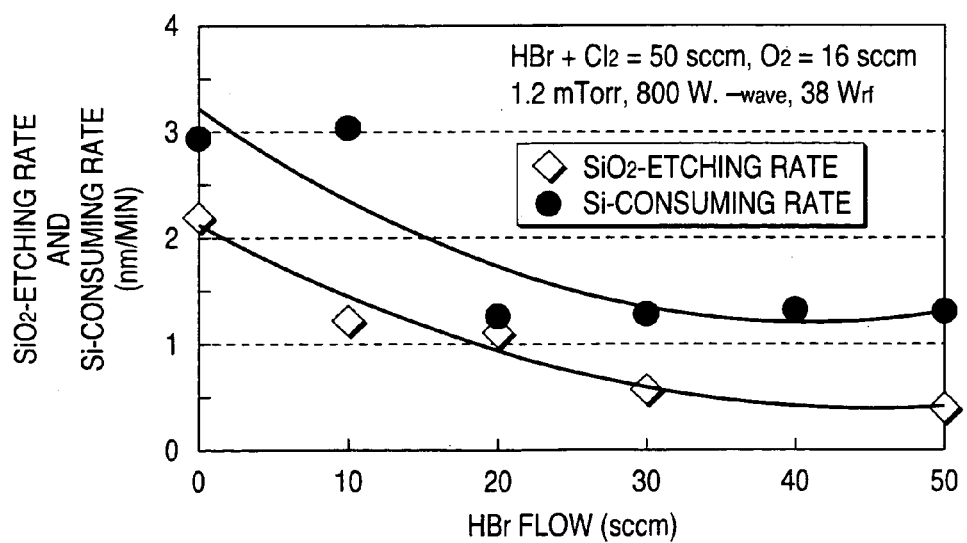
FIG. 10 is a chart showing the HBr flow dependency of the etching rate of a silicon oxide film and the consuming rate of silicon.

If the etching rate of the silicon oxide is set to be low at the second etching step, the residue is not generated. FIG. 10 shows a state in which the etching rate of a silicon oxide film and the consuming rate (oxidation rate) of silicon provided under a very thin silicon oxide film are changed when a part of $Cl_2$ in $Cl_2/O_2$ is replaced with HBr. It is apparent that both the etching rate of the silicon oxide film and the consuming rate of the silicon are reduced with an increase in an HBr flow.

If the etching rate of the silicon oxide is reduced at the second etching step, thus, the consuming rate of the silicon provided under the very thin silicon oxide film can also be reduced. More specifically, if the etching rate of the silicon oxide at the second etching step is reduced, the consumption of the silicon substrate is suppressed so that a residue is not generated.

A power having an ion current density of 0.5 to 3 mA/cm$^2$ on a substrate is selected for a source power and a power having Vpp of 40V or more or Vdc of 20 eV or more in an electrode provided with a substrate is selected for a bias power. Since an ion energy of 20 eV or more is required for cutting off Si—Si bonding, Vdc is set to be 20 eV or more. Moreover, the ion current density is set to be 0.5 to 3 mA. If the ion current density is too high, there is a problem in that an etching selectivity is deteriorated or an electronic screening damage is increased.

While the description has been given to the example in which the polycrystalline silicon film is used as the gate electrode in the embodiment, furthermore, the invention is not restricted thereto but can also be applied to patterning for other conductive films.

Moreover, the dielectric film is not restricted to the silicon oxide film. The invention can also be applied to the case in which a silicon nitride film, a film (an NO film) having a two-layer structure of a silicon nitride film and a silicon oxide film, or a film having a three-layer structure of a silicon oxide film, a silicon nitride film and a silicon oxide film is used.

As described above, according to the invention, it is possible to form a fine pattern with high precision while maintaining a smooth substrate surface condition without an etching residue also in the case in which a substrate film is very thin.

What is claimed is:

1. A method of manufacturing a semiconductor device in patterning of a conductive film and a thin dielectric film, comprising the steps of:
   a first etching step of carrying out anisotropic etching until most of the conductive film in a flat portion of the dielectric film disappears, the first etching step using a mixed gas including $O_2$; and
   a second etching step of increasing a selective ratio to the dielectric film, by increasing the flow ratio of $O_2$ to etch the conductive film in a first desired portion of the dielectric film in a state in which the conductive film is caused to remain in a second desired portion of the dielectric film such that a thickness of the dielectric film provided under a grain boundary between the conductive film and the dielectric film provides a pattern to prevent oxidation species associated with the mixed gas from reaching an interface with a substrate after the first etching step;
   wherein the second etching step uses a hydrogen bromide (HBr)/$Cl_2$/$O_2$ plasma, wherein the second etching step is executed at an in-chamber pressure of 2 mTorr or less, and further wherein the conductive film is a silicon type conductive film.

2. The method of manufacturing a semiconductor device according to claim 1, wherein the second etching step includes a step of carrying out etching while growing a silicon oxide film by a reaction of the oxidation species and the substrate.

3. The method of manufacturing a semiconductor device according to claim 1, wherein the dielectric film is a silicon oxide film having a thickness of 5 nm or less.

4. The method of manufacturing a semiconductor device according to claim 1, wherein the silicon type conductive film is a polycrystalline silicon film.

5. The method of manufacturing a semiconductor device according to any of claim 1, wherein the first and second etching steps are ECR plasma etching steps.

6. The method of manufacturing a semiconductor device according to claim 1, wherein the first etching step uses the hydrogen bromide (HBr)/$Cl_2$/$O_2$ plasma.

7. The method of manufacturing a semiconductor device according to claim 1, wherein the first etching step uses a $Cl_2$/$O_2$ plasma.

8. The method of manufacturing a semiconductor device according to claim 1, wherein the dielectric film is a gate oxide film and the conductive film is a gate electrode.

* * * * *